(12) United States Patent
Heintz et al.

(10) Patent No.: US 11,480,595 B2
(45) Date of Patent: Oct. 25, 2022

(54) ESTIMATION OF A PHYSICAL QUANTITY BY A DISTRIBUTED MEASUREMENT SYSTEM

(71) Applicant: VOLTALIS, Paris (FR)

(72) Inventors: Bruno Heintz, Paris (FR); Mathieu Bineau, Versailles (FR); Marc Autord, Guerville (FR); Jean Marc Oury, Paris (FR)

(73) Assignee: VOLTALIS, Paris (FR)

( * ) Notice: Subject to any disclaimer, the term of this patent is extended or adjusted under 35 U.S.C. 154(b) by 0 days.

(21) Appl. No.: 17/282,742

(22) PCT Filed: Oct. 1, 2019

(86) PCT No.: PCT/FR2019/052317
§ 371 (c)(1),
(2) Date: Apr. 2, 2021

(87) PCT Pub. No.: WO2020/070434
PCT Pub. Date: Apr. 9, 2020

(65) Prior Publication Data
US 2022/0003802 A1 Jan. 6, 2022

(30) Foreign Application Priority Data
Oct. 4, 2018 (FR) ..................... 18 59197

(51) Int. Cl.
*G01R 21/133* (2006.01)
*H02J 13/00* (2006.01)

(52) U.S. Cl.
CPC ...... *G01R 21/133* (2013.01); *H02J 13/00002* (2020.01)

(58) Field of Classification Search
CPC .... G01R 21/133; H02J 13/00002; H02J 3/14; H02J 13/00004; H02J 13/00006;
(Continued)

(56) References Cited

U.S. PATENT DOCUMENTS 10,797,639 B1 * 10/2020 Hoff .................. G06F 30/00
11,183,873 B2 * 11/2021 Heintz .................. H02J 3/14
(Continued)

FOREIGN PATENT DOCUMENTS

WO   WO-2015048737 A1 *  4/2015  ....... G06Q 10/06315

OTHER PUBLICATIONS

International Search Report dated Jan. 2, 2020.

*Primary Examiner* — Manuel A Rivera Vargas
*Assistant Examiner* — Yaritza H Perez Bermudez
(74) *Attorney, Agent, or Firm* — Ipsilon USA, LLP

(57) ABSTRACT

The invention relates to the estimation of a time-variable physical quantity by a distributed system comprising a centralized platform and a set of distributed measurement devices each communicating with the platform via a communication network, on the basis of the measurement (100), by each device of the set, of a local datum representative of the physical quantity, the collection (120) by the centralized platform, over a predetermined sampling period, of measurement samples originating from a subset of devices of said set via said communication network, and the estimation (130) of the physical quantity over the sampling period on the basis of the collected samples. According to the invention, each device of said set executes (110), in each sampling period, a local algorithm deciding randomly and based on a sending probability associated with each device, whether the corresponding measurement device is part of said subset. The physical quantity is estimated on the basis of the measurement samples collected and the predefined sending probability for each device belonging to the subset.

8 Claims, 2 Drawing Sheets

(58) Field of Classification Search
CPC .. H02J 2310/14; Y02B 70/30; Y02B 70/3225; Y04S 20/222; Y04S 20/242
See application file for complete search history.

(56) References Cited

U.S. PATENT DOCUMENTS

| | | | | |
|---|---|---|---|---|
| 11,183,874 | B1* | 11/2021 | Finkelstein | H02J 13/00016 |
| 2013/0217409 | A1* | 8/2013 | Bridges | B60L 53/64 |
| | | | | 455/456.1 |
| 2013/0238266 | A1* | 9/2013 | Sawides | H02J 3/14 |
| | | | | 702/61 |
| 2014/0232372 | A1* | 8/2014 | Heintz | H02J 3/14 |
| | | | | 324/76.47 |
| 2016/0233682 | A1* | 8/2016 | Do Rosario | G06Q 50/06 |
| 2020/0227940 | A1* | 7/2020 | Heintz | H02J 13/00004 |
| 2021/0055839 | A1* | 2/2021 | Capute | H02J 13/00034 |

* cited by examiner

ESTIMATION OF A PHYSICAL QUANTITY BY A DISTRIBUTED MEASUREMENT SYSTEM

RELATED APPLICATION

This application is a National Phase of PCT/FR2019/052317 filed on Oct. 1, 2019, which claims the benefit of priority from French Patent Application No. 18 59197, filed on Oct. 4, 2018, the entirety of which are incorporated by reference.

FIELD OF THE INVENTION

The present invention relates generally to the estimation of a time-variable physical quantity by a distributed measurement system comprising a centralized platform and a set composed of a plurality of distributed measurement devices, each able to measure a local datum representative of said physical quantity and to communicate remotely with said centralized platform via a communication network.

DESCRIPTION OF RELATED ART

One field of application that is targeted quite particularly, although not exclusively, by the invention is that of managing and/or monitoring the electricity consumption of electrical appliances, for example domestic electrical appliances, situated in the homes of a particularly high number of consumers and connected to an electricity distribution network.

It is conventional in such systems to install at least one electronic measurement device on a plurality of sites (households, commercial buildings, communities, etc.), connected locally to at least one electrical appliance being monitored so as to be able to preferably continuously measure electricity consumption of this electrical appliance. A dedicated centralized platform, in the form of one or more servers, then obtains electricity consumption measurement samples, preferably in real time, that are communicated by each local measurement device of the system. The centralized platform is thus able to determine the elementary load curves, that is to say the temporal variation of the relative consumption at each of the loads or electrical appliances being monitored, and deduce an overall load curve therefrom by aggregating these elementary load curves.

For a system dedicated to monitoring the electricity consumption only, the measurement devices distributed over the various sites may typically be "smart" electricity meters, able to measure the electrical power consumed by one or more electrical appliances so as to periodically deliver electricity consumption measurement samples.

The applicant also proposes a distributed system for modulating the consumption of a set composed of a very high number of electrical appliances (such as water heaters, electric heaters, air conditioners, etc.) situated in the homes of a large number of users, in which the various load curves obtained by distributed measurement devices make it possible in particular to provide a distributed load shedding service, by means of which it is possible to select, in real time, from the set of all of the measurement devices connected locally to the electrical appliances, a subset of measurement devices to which the system, in particular the centralized platform, will send orders for momentary cessation of operation, so as to reduce the power consumption of the set by a given setpoint value. A system of this type is for example in the application WO2008/017754 or in the application WO2012/172242. This system, while also being able, via stop and restart orders, to selectively modulate the supply of power to certain electrical appliances by analyzing the consumption of a large number of users, makes it possible to adapt the electricity consumption to the electricity production available at a given time.

When the measurement systems are massively distributed, with a set comprising a very large number of distributed measurement devices, the knowledge of the physical quantity aggregated from the measurement samples taken by the various measurement devices requires the transmission of a very high number, typically hundreds of thousands (or even more), of measurements by the measurement devices. Whatever the communication network used to transmit the data, this takes up a substantial amount of the bandwidth of the network. In addition, for some types of communication network such as cellular networks, the volumes of data required for this transmission may entail significant costs. This problem therefore constitutes a limitation on increasing the scope of these systems, i.e. the number of distributed measurement devices.

The above problem is increased in massively distributed electricity consumption measurement systems, such as that described in applications WO2008/017754 and WO2012/172242 cited above, for which it is important to know, in real time, the exact aggregated load curve on the basis of the real-time transmission of a large number of consumption measurements.

In such systems, the centralized platform obtains electricity consumption measurement samples with a sampling period generally of the order of around ten minutes. A more precise aggregated load curve could be obtained by reducing the sampling period, for example by using a greatly reduced sampling period, typically of the order of around ten seconds or even a second. The number of measurements that must not only be collected but also aggregated over a sampling period by the centralized platform becomes too large in this case.

To solve the problem due to the large number of collected measurements, which is directly dependent on the number of measurement devices in the set and/or on the sampling frequency of the measurements, it is known practice to use a limited number of measurements collected within a subset, called a sampling subset, and then to estimate the physical quantity, for example the overall load curve, by extrapolation from the measurements collected from this subset. The precision of the estimate greatly depends on how the sampling subset was constructed.

However, to date, the known solutions are based on conventional sampling techniques for which the formation of a representative sample, i.e. in this case the selection of the subset of sampled measurement devices, is performed conventionally, once and for all and on the initiative of the sampler, completely randomly, by stratification, by cluster sampling or by quota sampling.

These types of sampling therefore provide the pre-selection of only a portion of the measurement instruments constituting the set in the system, the belonging of which to the sample considered to be representative is due to the observation of past behavior (consumption over the past hour, the past day, etc.) or of a certain configuration (measured device, subscriber pricing, location, etc.).

This representative subset or sample, whatever the method used for formation, is static, or near static, i.e. its composition hardly varies with respect to the frequency at which the measurements are taken.

However, beyond the clear difficulty in selecting a representative subset over an observation period, it is not guaranteed that this representativeness observed in the past will adequately predict future measurements.

Experience shows that, for a subset to be representative over future observations, the sampled subset has to be of very large size, which considerably limits the advantages of sampling.

OBJECTS AND SUMMARY

The object of the present invention is to overcome the drawbacks of the systems using the aforementioned conventional sampling techniques.

To that end, one subject of the invention is a method for estimating a time-variable physical quantity by means of a distributed measurement system comprising a centralized platform and a set composed of a plurality of distributed measurement devices each able to communicate remotely with said centralized platform via a communication network, the method comprising a step of measuring, by means of each measurement device of said set, a local datum representative of said physical quantity, a step of collecting, over a predetermined sampling period T, measurement samples originating from a subset of said set in which each measurement device belonging to said subset transmits, to said centralized platform, a measurement sample $P_i$ of the local datum via said communication network, and a step of estimating said physical quantity over the sampling period on the basis of an aggregate of the collected measurement samples $P_i$, the method being characterized in that it comprises, in each sampling period T, a phase of executing, at each measurement device of said set, a local decision algorithm able to decide, randomly and based on a sending probability $\pi_i$ associated with each measurement device, whether the corresponding measurement device is part of said subset, and in that said physical quantity is estimated in each sampling period T on the basis of the collected measurement samples $P_i$ and the sending probability $\pi_i$ associated with each measurement device belonging to said subset by calculation according to the following relationship $$\sum_{i=1}^{N'} \frac{P_i(T)}{\pi_i(T)}$$

in which N' is the number of measurement devices of the subset.

Thus, the present invention makes it possible to dynamically and randomly create, in each sampling period, the subset of measurement devices that will participate in the sampling and allow, by aggregation, precise and rapid estimation of the physical quantity. In addition, the creation of the subset is performed by means of the measurement devices only which decide, randomly, whether or not to participate in the sampling in each sampling period.

According to one possible implementation of the method according to the invention, the sending probability $\pi_i$ associated with at least one measurement device of said set has a value that is variable according to the value of the measurement sample $P_i$ taken and/or conditions under which the measurement is taken and/or the time of the measurement; in this case, if said at least one measurement device is part of said subset, said at least one measurement device transmits the sending probability to the centralized platform via said communication network in the collection step, at the same time as the measurement sample $P_i$ of the local datum.

According to another possible implementation of the method according to the invention, the sending probability $\pi_i$ is transmitted to the centralized platform by each measurement device belonging to said subset via said communication network in the collection step, at the same time as the measurement sample $P_i$ of the local datum.

In one possible implementation, the method may further comprise a step of updating the local decision algorithm and/or the sending probability $\pi_i$ associated with at least one measurement device of said set.

In some cases, the sampling period T may be shorter than or equal to 10 minutes.

The sampling period T may in particular be advantageously substantially of the order of a second or of around ten seconds, which is particularly useful for a system having to estimate the physical quantity over a sampling period in real time.

Another subject of the invention is a distributed measurement system for estimating a time-variable physical quantity, the system comprising a centralized platform and a set composed of a plurality of distributed measurement devices each able to communicate remotely with said centralized platform via a communication network, the system being configured such that, in a measurement step, each measurement device of said set measures a local datum representative of said physical quantity, in a collection step, each measurement device belonging to a subset of said set transmits, to said centralized platform, a measurement sample $P_i$ of the local datum via said communication network over a predetermined sampling period T, and, in an estimation step, the centralized platform estimates said physical quantity over the sampling period on the basis of an aggregate of the collected measurement samples, characterized in that each measurement device of said set comprises a software module configured to execute, in each sampling period, a local decision algorithm able to decide, randomly and based on a sending probability associated with each measurement device, whether the corresponding measurement device is part of said subset, and in that the centralized platform is configured to estimate, in each sampling period T, the physical quantity on the basis of the collected measurement samples $P_i$ and the sending probability $\pi_i$ associated with each measurement device belonging to said subset by calculation according to the following relationship $$\sum_{i=1}^{N'} \frac{P_i(T)}{\pi_i(T)}$$

in which N' is the number of measurement devices of the subset.

The local datum is for example an electrical power drawn by a local load comprising one or more domestic electrical appliances connected to an electricity distribution network, and the physical quantity is then the total electrical power consumed.

BRIEF DESCRIPTION OF DRAWINGS

The invention will be better understood from reading the following description, given with reference to the appended figures, in which.

DETAILED DESCRIPTION

In the remainder of the disclosure, the invention will be described in the context of determining an overall load curve comprising aggregation of elementary load curves corresponding to the temporal evolution of the electricity consumption of a plurality of electrical appliances. The physical quantity to be estimated is therefore in this case the total electrical power consumed by a plurality of electrical appliances. As indicated above, the principle of the invention may nevertheless be applied to other physical quantities, for example to other types of power consumed.

Figure 1:
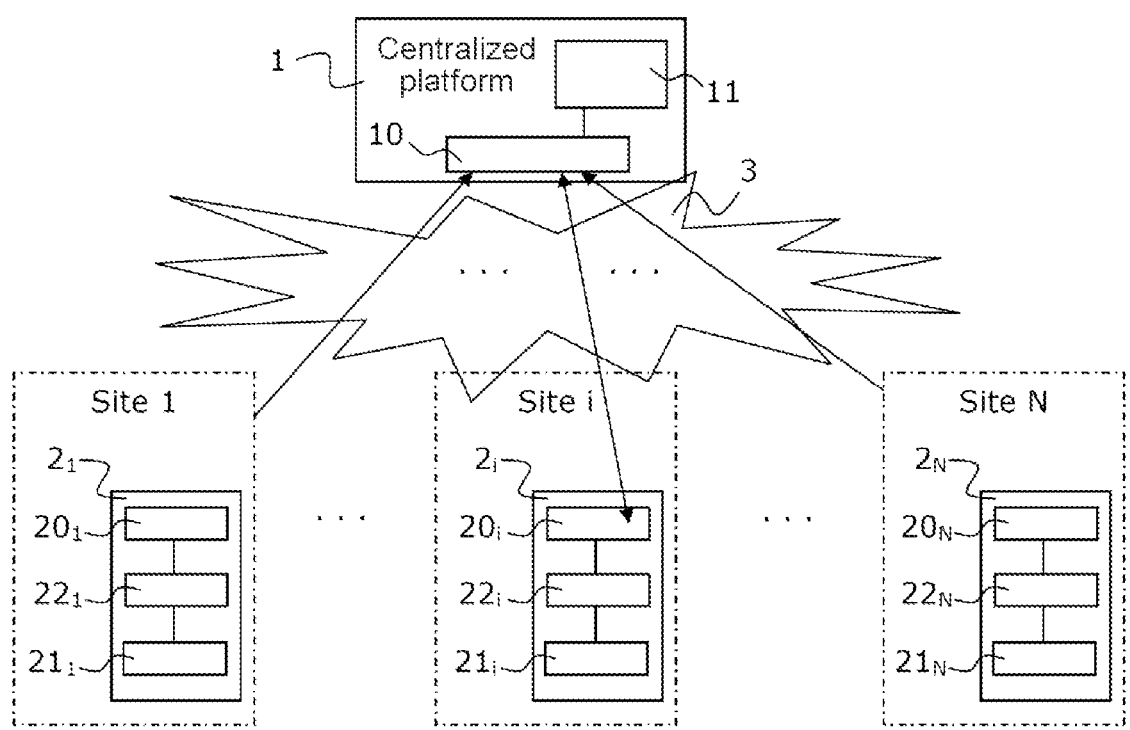
FIG. 1 gives one example of the architecture of a distributed measurement system able to implement the invention.

FIG. 1 illustrates the architecture of a distributed measurement system 1 allowing the estimation of the electrical power consumed by electrical appliances (not shown), for example domestic electrical appliances, connected to an electricity distribution network (not shown) and located at a number N of sites. The system comprises a centralized platform 1, hosted by one or more Internet servers, and a set composed here of N measurement devices $2_1, \ldots 2_i, \ldots 2_N$ distributed over the N sites. Throughout the rest of the description, the index i is used for any reference to a measurement device $2_i$ located at the site i, i being an integer varying from 1 to at most N.

Each measurement device $2_i$ is able to communicate remotely with the centralized platform 1 via a communication network 3. To that end, each measurement device $2_i$ comprises for example a wireless communication modem $20_i$ allowing the establishment, with a corresponding communication modem 10 at the centralized platform 1, of a connection of packet telephony type, such as GPRS, 3G or 4G. Alternatively, the connection may be made via a link of Ethernet type.

Each measurement device $2_i$ is also able to measure the electrical power consumed locally by the electrical appliances to which it is connected, via a module $22_i$ for measuring the voltages and currents. The measurement devices $2_i$ are for example smart electricity meters installed at each site i. In another possible architecture where the system may modulate the electrical power by providing a distributed load shedding service, each measurement device $2_i$ is composed of one or more units such as driver units and modulator boxes described in applications WO2008/017754 and WO2012/172242 cited above, incorporated by reference. Unlike a meter, these devices are also able to execute orders to stop/restart the operation of one or more electrical appliances to which they are connected, which orders are received from the centralized platform for the management of limited load shedding.

Whatever the case, to avoid a large data transmission, the system is configured to estimate the total power consumed on the basis of measurement samples taken by a subset of measurement devices, or sampling subset, which is considered to be representative. Specifically, the system is configured to implement the following steps:

a measurement step, in which each measurement device $2_i$ of the set of N devices measures the electrical power Pi consumed locally;

a collection step, in which only a number N' smaller than N of measurement devices $2_i$, corresponding to the sampling subset, transmits, to the centralized platform 1, a measurement sample of the electrical power $P_i$ consumed locally via the communication network 3 over a predetermined sampling period T; and an estimation step, in which the centralized platform 1 estimates the total power consumed over the sampling period T on the basis of an aggregate of the collected measurement samples.

Unlike the systems that use conventional sampling techniques with a fixed representative subset, the system according to the invention makes provision for changing, in each sampling period T, the scope of the sampling subset, i.e. the selection of measurement devices which will actually transmit their measurement in the collection step.

To that end, in accordance with the invention, each of the N measurement devices $2_i$ executes, in each sampling period T, a local decision algorithm stored in a software module $21_i$ and able to decide randomly, based on a sending probability $\pi_i$ associated with each measurement device $2_i$, whether or not the corresponding measurement device will send its measurement sample $P_i$ to the centralized platform 1.

In other words, each measurement device $2_i$ is able to decide, randomly, whether or not it will be part of the sampling subset transmitting the measurement samples over the sampling period T.

In one possible embodiment, all of the measurement devices $2_i$ have the same predefined sending probability $\pi_i$ over the period T and the same local decision algorithm.

The local decision algorithm may follow the Bernoulli distribution and implement for example the following steps:

generating a random number, with a value of between 0 and 100 for example;

if the generated random number is smaller than the value assigned to the percentage of the sending probability $\pi_i$, for example smaller than 10 if the sending probability $\pi_i$ is equal to 10%, the measurement device $2_i$ transmits the measurement sample Pi to the centralized platform 1 (in other words the measurement device then forms part of the sampling subset).

otherwise, the measurement device $2_i$ does not transmit the measurement sample $P_i$ to the centralized platform 1.

In another possible embodiment, the sending probability $\pi_i$ may have a fixed value, predefined over the period T, but different from one measurement device to the next.

In another possible embodiment, the sending probability $\pi_i$ for one or more measurement devices $2_i$ of said set (or even for all of the measurement devices) has a value that is variable according to the value of the measurement sample $P_i$ taken and/or conditions under which the measurement is taken and/or the time of the measurement. Thus, by way of non-limiting example, it is possible to make provision for the sending probability $\pi_i$ for a measurement device $2_i$ to be equal to 0% if the value of the measurement sample $P_i$ taken over the sampling period in question is zero. In other words, this measurement device $2_i$ does not send the zero measurements, and will not form part of the sampling subset. If the measurement device $2_i$ is part of a modulation system providing the distributed load shedding service, it is also possible to make provision, by way of example, for the sending probability it for this measurement device $2_i$ to be equal to 100% if the value of the measurement sample $P_i$ taken over the sampling period in question is not zero while an order to disconnect the electrical appliances connected to this device should be under way. In other words, a measurement device $2_i$ may choose to systematically send its measurement as soon as it deems a situation to be abnormal.

The centralized platform must, as will be apparent hereinafter, know the sending probability $\pi_i$ corresponding to any measurement sample that it collects. Thus, provision is made for the measurement devices $2_i$ that belong to the sampling subset and the sending probability of which varies, for whatever reason, to transmit their sending probability $\pi_i$ to the centralized platform 1 via said communication network 3 in the collection step 120, at the same time as their measurement sample $P_i$.

In another possible embodiment, provision may be made for the predefined sending probability $\pi_i$ to be transmitted systematically, whether it is variable or otherwise, to the centralized platform 1 by each measurement device $2_i$ belonging to said subset via said communication network 3 in the collection step 120, at the same time as the measurement sample $P_i$.

It is possible to make provision for at least one or more, or even all of the measurement devices of the set to be able to perform updates of the local decision algorithm and/or of the predefined sending probability $\pi_i$. The updates may be transmitted by the centralized platform 1. As a variant, the updates are performed on the basis of information calculated or measured locally by the measurement devices.

Once the centralized platform 1 has collected the various measurement samples $P_i$ transmitted by the N' measurement devices of the sampling subset, and, where applicable, the corresponding sending probabilities $\pi_i$, it will be able to process these samples at a processing module 11, and in particular estimate the total power P(T) consumed over the sampling period T on the basis of the collected measurement samples $P_i$ and the sending probability $\pi_i$ associated with each measurement device belonging to said sampling subset.

It is shown in particular that a good estimate of the total power P(T) consumed over a sampling period T may be obtained by the following relationship:

$$P(T) = \sum_{i=1}^{N'} \frac{P_i(T)}{\pi_i(T)}$$

which takes into account only the N' measurement devices of the sampling subset.

The above relationship is of course based on the assumption that the measurements transmitted by the N' devices are all actually received. Otherwise, the relationship applies to the number of measurements actually collected.

Experience shows that in the case of a value to be estimated over time (temporal sequence), the method of dynamically generating a sampling subset in each sampling period T is much more precise than the "static" or "near-static" methods. This precision may be explained by the fact that the selection bias is similar to fluctuations due to the dynamic formation of the sampling subset, and that the average of the errors then approaches zero.

Figure 2:
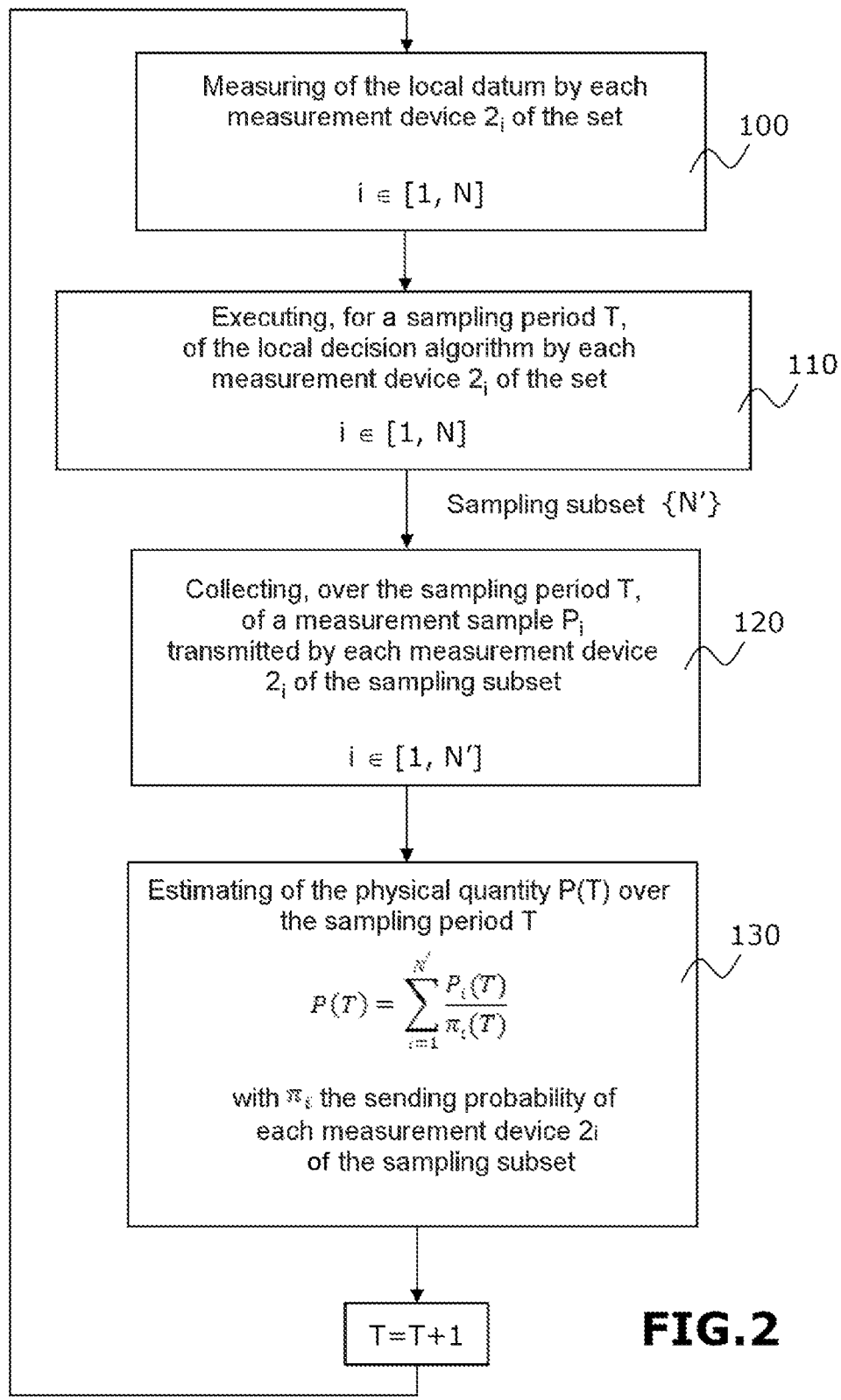
FIG. 2 illustrates steps that may be implemented in a method for estimating a physical quantity in accordance with the invention, for example by means of the system of FIG. 1.

FIG. 2 summarizes the steps that may be implemented in a method for estimating a physical quantity in accordance with the invention, for example by means of the system of FIG. 1 comprising N distributed measurement devices $2_i$, and for which the physical quantity is the total electrical power consumed over a sampling period T:

The estimation method comprises a first step 100 of measuring a local datum representative of the physical quantity to be estimated by each of the N measurement devices $2_i$ forming the starting set.

In a step 110, each of the N measurement devices $2_i$ of the set executes its local decision algorithm, in order to randomly decide whether or not it will transmit a measurement sample $P_i$ over the sampling period T in question. This step 110 makes it possible to dynamically determine the sampling subset formed of N' measurement devices $2_i$ which have each decided, on completing the execution of their local decision algorithm, to transmit their measurement sample $P_i$ according to their sending probability $\pi_i$. In the case where the measurement device in question has, as mentioned above, a plurality of possible values for the sending probability $\pi_i$, this step further comprises selecting (not shown) the sending probability value which will actually be associated with the measurement.

Once the sampling subset has been determined for the sampling period T in question, the method continues with a step 120 of collecting, by means of the centralized platform 1, the measurement samples $P_i$ transmitted by the measurement devices $2i$ of the sampling subset only. As seen above, the sending probability may, or must in certain cases, also be transmitted with the corresponding measurement sample $P_i$.

The last step 130 comprises estimating the physical quantity P(T) over the sampling period T on the basis of the at most N' measurement samples $P_i$ collected in step 120 by the centralized platform 1 and the sending probabilities $\pi_i$ associated therewith, preferably by applying the relationship $$P(T) = \sum_{i=1}^{N'} \frac{P(T)_i}{\pi_i(T)}$$

The various steps are reiterated in each sampling period, so as to obtain a different sampling subset each time.

This makes it possible in particular to involve all of the measurement devices and to maintain representativeness over time.

The sampling period T may be of the order of 10 minutes. However, the use of a dynamically created sampling subset allows this sampling period to be reduced considerably. It has been shown in particular that it was possible to precisely estimate an aggregated load curve for a massively distributed system comprising around one hundred thousand sites with a sampling period T of the order of 10 seconds, or even of a second, without incurring significant costs in terms of data communication.

The estimation method according to the invention makes it possible to considerably reduce the number of sites that have to send measurements (going from 80% for a conventional sampling method with a static subset to around 10% by virtue of the invention) while at the same time retaining the precision criteria required for distributed solutions for participation in system services.

Compared to a conventional sampling method, it is not necessary in this case to perform a preliminary analysis of the fleet of measurement devices in order to select a representative subset. It is also not necessary to have prior knowledge of the fleet (location, type of pricing, type of site, etc.), which knowledge is not always accessible and the collection of which is time-consuming and expensive. In addition, the configuration of the fleet is subject to change (home moves, work, etc.) and keeping such knowledge up to date requires continuous allocation of resources.

Furthermore, it is also not necessary to monitor for potential failure of the measurement devices selected in the sampling subset since the sampling subset changes with each sampling period.

Each measurement device is, at one time or another, part of the sampling subset, which improves the representativeness and therefore the quality of the estimate.

In the case where the measurement devices have a variable sending probability, the useful information is also increased for the same volume of data transmitted.

The invention claimed is:

1. A method for estimating a time-variable physical quantity P(T) by means of a distributed measurement system having a centralized platform and a set composed of a plurality of distributed measurement devices each able to communicate remotely with said centralized platform via a communication network, the method comprising:
   a step of measuring, by means of each measurement device of said set, a local datum representative of said physical quantity,
   a step of collecting, over a predetermined sampling period T, measurement samples originating from a subset of said set in which each measurement device belonging to said subset transmits, to said centralized platform, a measurement sample $P_i$ of the local datum via said communication network, and
   a step of estimating said physical quantity P(T) over the sampling period on the basis of an aggregate of the collected measurement samples $P_i$,
   wherein the method includes, in each sampling period T, a phase of executing, at each measurement device of said set, a local decision algorithm able to decide, randomly and based on a sending probability $\pi_i$ associated with each measurement device, whether the corresponding measurement device is part of said subset by generating a random number and comparing said random number to said sending probability $\pi_i$, and wherein said physical quantity P(T) is estimated in each sampling period T on the basis of the collected measurement samples $P_i$ and the sending probability $\pi_i$ associated with each measurement device belonging to said subset by calculation according to the following relationship $$P(T) = \sum_{i=1}^{N'} \frac{P_i(T)}{\pi_i(T)}$$

in which N' is the number of measurement devices of the subset.

2. The method as claimed in claim 1, wherein the sending probability $\pi_i$ associated with at least one measurement device of said set has a value that is variable according to the value of the measurement sample $P_i$ taken and/or conditions under which the measurement is taken and/or the time of the measurement, and in that if said at least one measurement device is part of said subset, said at least one measurement device transmits the sending probability to the centralized platform via said communication network in the collection step, at the same time as the measurement sample $P_i$ of the local datum.

3. The method as claimed in claim 1, wherein the sending probability $\pi_i$ is transmitted to the centralized platform by each measurement device belonging to said subset via said communication network in the collection step, at the same time as the measurement sample $P_i$ of the local datum.

4. The method as claimed in claim 1, wherein said method further comprises a step of updating the local decision algorithm and/or the sending probability $\pi_i$ associated with at least one measurement device of said set.

5. The method as claimed in claim 1, wherein the sampling period T is shorter than or equal to 10 minutes.

6. The method as claimed in claim 5, wherein the sampling period T is of the order of a second or of around ten seconds.

7. A distributed measurement system for estimating a time-variable physical quantity P(T), the system comprising:
   a centralized platform and a set composed of a plurality of distributed measurement devices each able to communicate remotely with said centralized platform via a communication network, the system being configured such that, in a measurement step, each measurement device of said set measures a local datum representative of said physical quantity, in a collection step, each measurement device belonging to a subset of said set transmits, to said centralized platform, a measurement sample $P_i$ of the local datum via said communication network over a predetermined sampling period T, and, in an estimation step, the centralized platform estimates said physical quantity P(T) over the sampling period on the basis of an aggregate of the collected measurement samples,
   wherein each measurement device of said set comprises a software module configured to execute, in each sampling period, a local decision algorithm able to decide, randomly and based on a sending probability $\pi_i$ associated with each measurement device, whether the corresponding measurement device is part of said subset by generating a random number and comparing said random number to said sending probability $\pi_i$, and wherein the centralized platform is configured to estimate, in each sampling period T, the physical quantity P(T) on the basis of the collected measurement samples $P_i$ and the sending probability $\pi_i$ associated with each measurement device belonging to said subset by calculation according to the following relationship $$P(T) = \sum_{i=1}^{N'} \frac{P_i(T)}{\pi_i(T)}$$

in which N' is the number of measurement devices of the subset.

8. The system as claimed in claim 7, wherein the local datum is an electrical power drawn by a local load comprising one or more domestic electrical appliances connected to an electricity distribution network, and the physical quantity is the total electrical power consumed.

* * * * *